I (12) United States Patent
Yeh (10) Patent No.: US 7,843,274 B2
(45) Date of Patent: Nov. 30, 2010

(54) PHASE LOCK LOOP APPARATUS

(76) Inventor: Tse-Hsien Yeh, No. 20, Alley 218, Lane 75, Sec. 3, KangNing Road, NeiHu District, Taipei City (TW)

( * ) Notice: Subject to any disclaimer, the term of this patent is extended or adjusted under 35 U.S.C. 154(b) by 84 days.

(21) Appl. No.: 12/396,934

(22) Filed: Mar. 3, 2009

(65) Prior Publication Data
US 2009/0224842 A1   Sep. 10, 2009

Related U.S. Application Data

(60) Provisional application No. 61/033,968, filed on Mar. 5, 2008.

(51) Int. Cl.
*H03L 7/085* (2006.01)

(52) U.S. Cl. .......................... 331/1 A; 331/16; 331/17; 331/177 R; 375/296; 375/376

(58) Field of Classification Search ................. 331/1 A, 331/16, 17, 175, 177 R, 182, 185; 375/296, 375/376
See application file for complete search history.

(56) References Cited

U.S. PATENT DOCUMENTS

| | | | | |
|---|---|---|---|---|
| 5,347,233 | A * | 9/1994 | Ishibashi et al. | 331/2 |
| 5,373,255 | A * | 12/1994 | Bray et al. | 331/1 A |
| 6,154,071 | A * | 11/2000 | Nogawa | 327/156 |
| 6,765,445 | B2 | 7/2004 | Perrott et al. | |
| 6,937,075 | B2 * | 8/2005 | Lim et al. | 327/157 |
| 7,068,110 | B2 * | 6/2006 | Frey et al. | 331/17 |
| 7,292,078 | B2 * | 11/2007 | Jung et al. | 327/157 |
| 7,463,873 | B2 * | 12/2008 | Staszewski et al. | 455/260 |
| 2005/0085105 | A1 * | 4/2005 | Hanke et al. | 439/67 |
| 2005/0275471 | A1 * | 12/2005 | Matsunami | 331/16 |
| 2006/0098714 | A1 * | 5/2006 | Shin et al. | 375/130 |
| 2006/0125537 | A1 | 6/2006 | Yeh | |
| 2006/0267643 | A1 * | 11/2006 | Takase | 327/156 |

\* cited by examiner

*Primary Examiner*—Joseph Chang
*Assistant Examiner*—Jeffrey Shin
(74) *Attorney, Agent, or Firm*—Muncy, Geissler, Olds & Lowe, PLLC (57) ABSTRACT

A phase lock loop apparatus is disclosed. The phase lock loop apparatus comprises a phase detecting module, a logic processing module, a charge pump and loop filter (CPLF), and a voltage control oscillator. The phase detecting module detects the phase difference between an input data signal and a clock signal to generate a first index signal. The logic processing module performs a high-frequency dithering process to the first index signal to generate a second index signal. The CPLF adjusts a control voltage according to the first index signal and the second index signal, and outputs the adjusted control voltage. The voltage control oscillator adjusts the frequency or phase of the clock signal and outputs the adjusted clock signal to the phase detecting module. The frequency of the second index signal is equal to or larger than the frequency of the first index signal.

20 Claims, 6 Drawing Sheets

PHASE LOCK LOOP APPARATUS

BACKGROUND OF THE INVENTION

1. Field of the Invention

The invention relates to a phase lock loop (PLL) apparatus, and more particularly, to the PLL apparatus capable of performing a high-frequency dithering to an index signal to prevent a jitter peak shown in a jitter tolerance curve related to the PLL apparatus.

2. Description of the Prior Art

Figure 1:
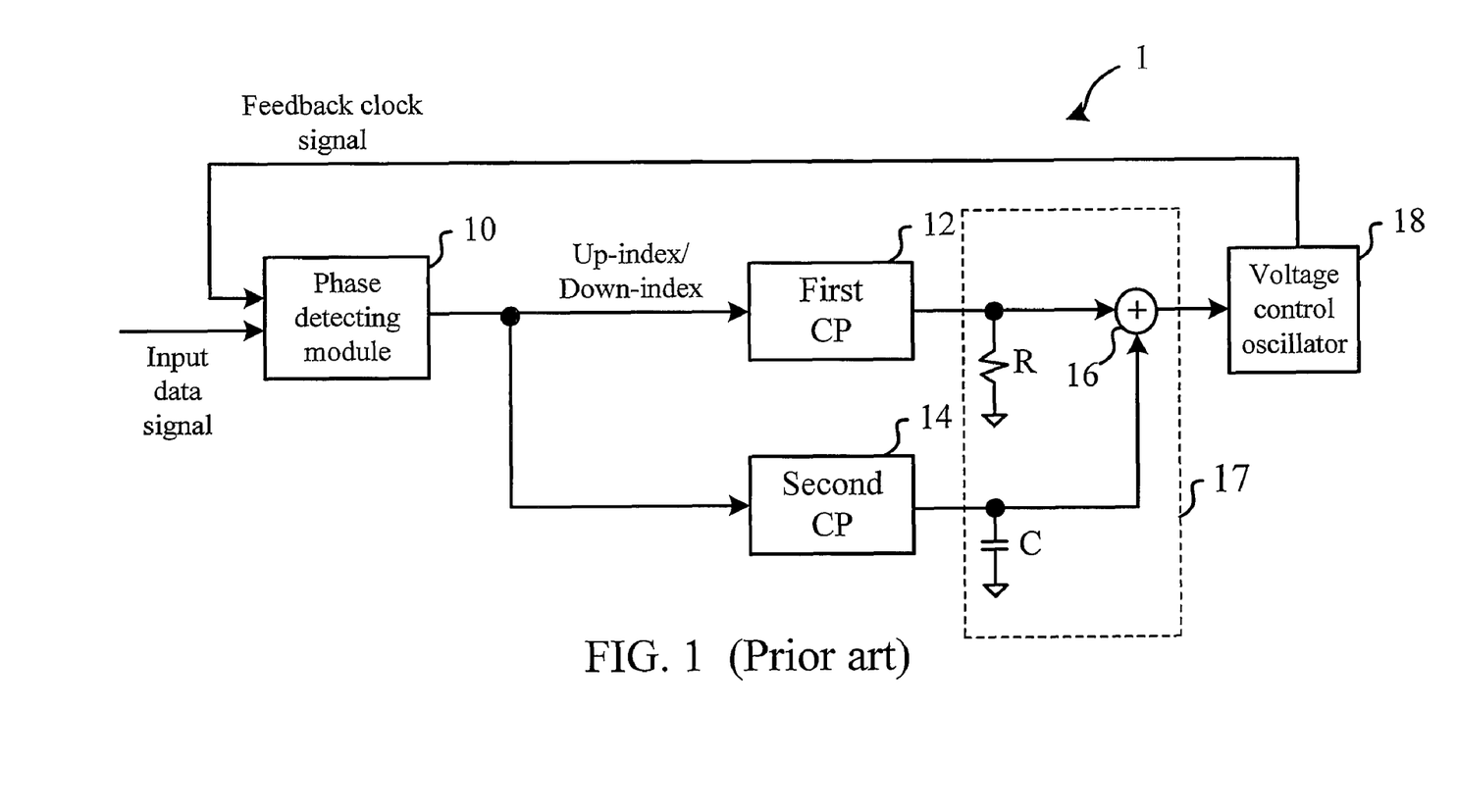
FIG. 1 shows a scheme diagram of the conventional phase lock loop (PLL) apparatus.

Please refer to FIG. 1. FIG. 1 shows a scheme diagram of the conventional PLL apparatus. As shown in FIG. 1, the PLL apparatus 1 comprises a phase detector 10, a first charge pump (CP) 12, a second CP 14, a voltage control oscillator 18, and a loop filter (LF) 17 formed by an adder 16, a resistor R, and a capacitor C.

When the phase detector 10 detects the phase difference between an input data signal and a feedback clock signal, the phase detector 10 will generate an up-index or a down-index. On the contrary, if there is no phase difference between the input data signal and the feedback clock signal, the phase detector 10 will not generate the up-index or the down-index. If the up-index is 1, it means that the phase of the feedback clock signal lags the phase of the input data signal; if the down-index is 1, it means that the phase of the feedback clock signal leads the phase of the input data signal. If the current flowing through the first CPLF 12 is $I_1$ and the current flowing through the second CPLF 14 is $I_2$, the control voltage that the voltage control oscillator 18 receives should be $I_1 R+(I_2/SC)$.

Although a probability shaping device can be added in front of the second CPLF 14 in the PLL apparatus 1 to change the frequency of outputting the up-index or the down-index. However, the frequency of outputting the changed up-index or down-index is smaller than the frequency of outputting the unchanged up-index or down-index. Furthermore, this method can not improve the jitter peak shown in certain frequency region of the jitter tolerance curve. For example, in the jitter tolerance curve of the conventional PLL apparatus 1, there will be an obvious jitter peak 62 formed in the corner-band-frequency region which has bad effect on the performance of the PLL apparatus 1.

Therefore, the invention provides a PLL apparatus to solve the above-mentioned problems.

SUMMARY OF THE INVENTION

The invention provides a phase lock loop (PLL) apparatus. The PLL apparatus can perform a high-frequency dithering to an index signal to prevent a jitter peak shown in a jitter tolerance curve related to the PLL apparatus.

A first embodiment of the invention is a PLL apparatus. In this embodiment, the PLL apparatus comprises a phase detecting module, a logic processing module, a CPLF, and a voltage control oscillator, wherein the logic processing module is coupled to the phase detecting module; the CPLF is coupled to the logic processing module; the voltage control oscillator is coupled to the CPLF.

When the phase detecting module detects the phase difference between an input data signal and a feedback clock signal, the phase detecting module will generate a first index signal. In fact, the first index signal can be an up-index or a down-index. Then, the logic processing module will receive the first index signal and perform a high-frequency dithering to the first index signal to generate a second index signal. The first index signal can be an up-index or a down-index.

Afterward, the CPLF receives the first index signal and the second index signal and adjusts a control voltage according to the first index signal and the second index signal, and then the CPLF outputs the control voltage. Then, the voltage control oscillator adjusts the frequency or phase of the clock signal according to the control voltage, and then outputs the adjusted clock signal to the phase detecting module.

In practical applications, the high-frequency dithering is performed to decrease the probability that a jitter peak is shown in a jitter tolerance curve related to the PLL apparatus. In addition, the logic processing module can also perform a low-filtering process to the first index signal, so that the frequency of outputting the second index signal will be equal to or larger than the frequency of outputting the first index signal.

A second embodiment of the invention is also a PLL apparatus. In this embodiment, the PLL apparatus comprises a plurality of phase detecting modules, a logic processing module, a CPLF, and a voltage control oscillator, wherein the logic processing module is coupled to the plurality of phase detecting modules; the CPLF is coupled to the logic processing module; the voltage control oscillator is coupled to the CPLF.

When the plurality of phase detecting modules detect the phase difference between an input data signal and a feedback clock signal, the plurality of phase detecting modules will generate a plurality of first index signals. Then, the logic processing module will receive the plurality of first index signals and perform a high-frequency dithering to the first index signal to generate a second index signal.

Afterward, the CPLF receives the plurality of first index signals and the second index signal and adjusts a control voltage according to the plurality of first index signals and the second index signal, and then the CPLF outputs the control voltage. Then, the voltage control oscillator adjusts the frequency or phase of the clock signal according to the control voltage, and then outputs the adjusted clock signal to the plurality of phase detecting modules.

In practical applications, the high-frequency dithering is performed to decrease the probability that a jitter peak is shown in a jitter tolerance curve related to the PLL apparatus. In addition, the logic processing module can also perform a low-filtering process to the first index signal, so that the frequency of outputting the second index signal will be equal to or larger than the frequency of outputting the first index signal.

Compared with the prior art, the PLL apparatus of the invention can perform the low-filtering process to the first index signal via the logic processing module, and perform the high-frequency dithering process to make the frequency of outputting the second index signal equal to or larger than the frequency of outputting the first index signal and in single-bit form, so that the jitter peak shown in certain frequency region of the jitter tolerance curve can be prevented to improve the performance of the conventional PLL apparatus.

The advantage and spirit of the invention may be further understood by the following recitations together with the appended drawings.

DETAILED DESCRIPTION OF THE INVENTION

The main scope of the invention is to provide a phase lock loop (PLL) apparatus. The PLL apparatus of the invention can prevent the jitter peak shown in certain frequency region of the jitter tolerance curve to improve the drawbacks of the conventional PLL apparatus.

Figure 2:
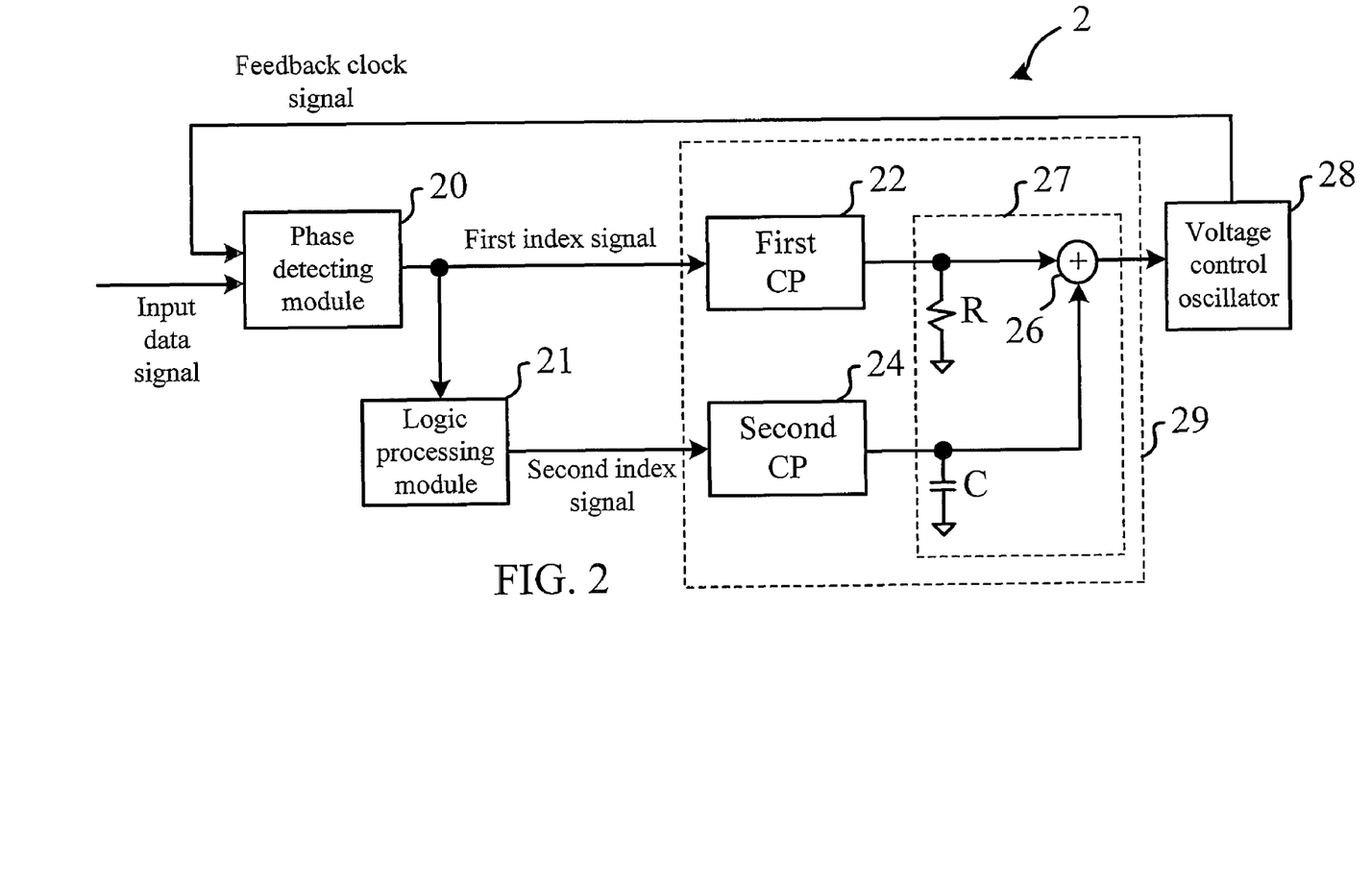
FIG. 2 shows a scheme diagram of the PLL apparatus in the first embodiment according to the invention.

A first embodiment according to the invention is a PLL apparatus. Please refer to FIG. 2. FIG. 2 shows a scheme diagram of the PLL apparatus of the first embodiment in this invention. As shown in FIG. 2, the PLL apparatus 2 comprises a phase detecting module 20, a logic processing module 21, a first CPLF 22, a second CPLF 24, a voltage control oscillator 28, and a loop filter (LF) 27 formed by an adder 26, a resistor R, and a capacitor C. In fact, a combination of the first CP 22, the second CP 24, and the LF 27 can be called a charge pump and loop filter (CPLF) 29.

In this embodiment, the first CP 22 is coupled to the phase detecting module 20; the logic processing module 21 is coupled between the phase detecting module 20 and the first CP 22; the second CP 24 is coupled to the logic processing module 21; the adder 26 is coupled to the first CP 22, the second CP 24, and the voltage control oscillator 28; the resistor R is coupled between the first CP 22 and the adder 26; the capacitor C is coupled between the second CP 24 and the adder 26; the voltage control oscillator 28 is coupled to the phase detecting module 20.

When the phase detecting module 20 receives an input data signal and a feedback clock signal, the phase detecting module 20 detects the phase difference between the input data signal and the feedback clock signal to generate a first index signal. In fact, the first index signal can be an up-index or a down-index. If there is no phase difference between the input data signal and the feedback clock signal, the phase detecting module 20 will not generate the up-index or the down-index. If the up-index is 1, it means that the phase of the feedback clock signal lags the phase of the input data signal; if the down-index is 1, it means that the phase of the feedback clock signal leads the phase of the input data signal.

Figure 3:
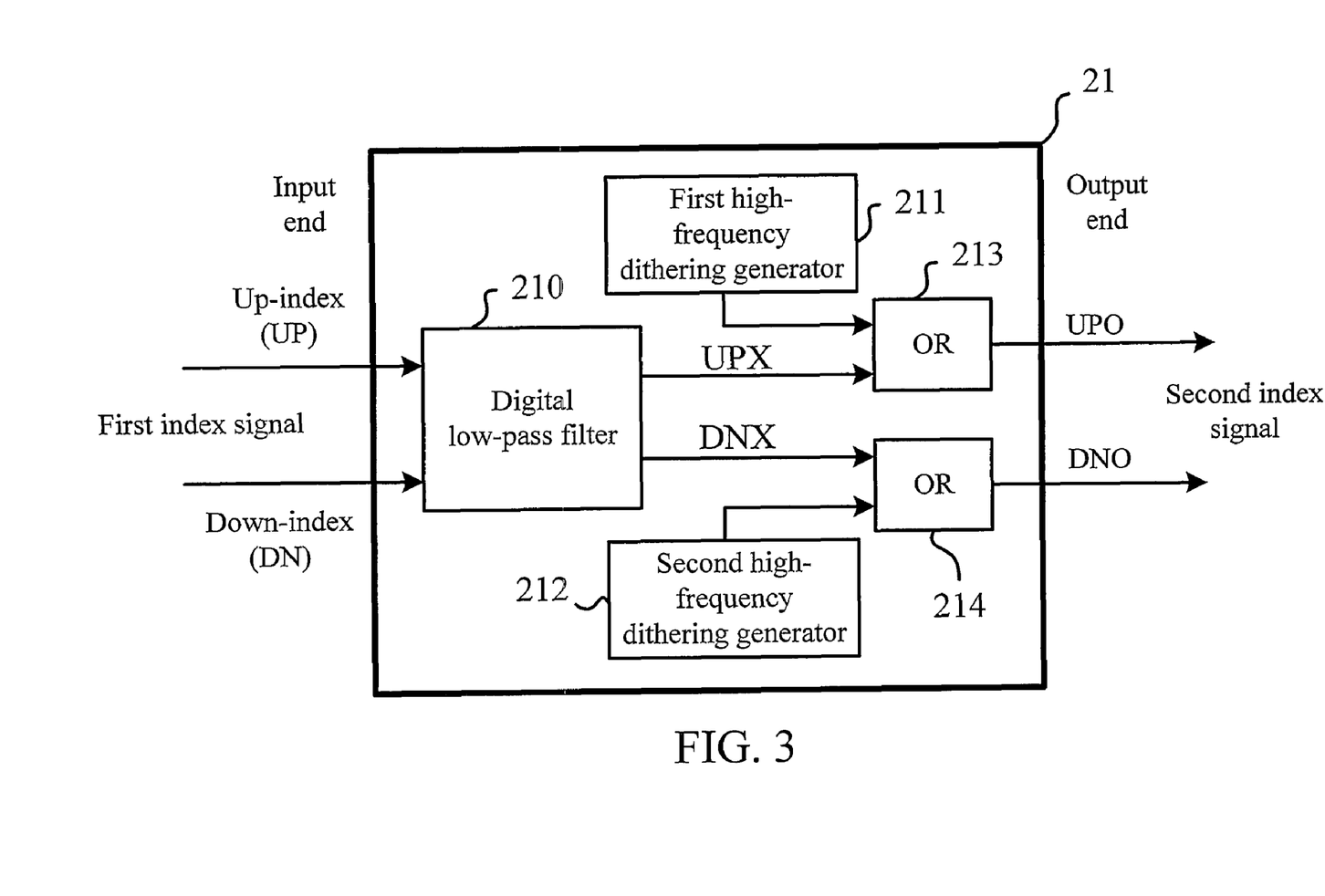
FIG. 3 shows a detailed scheme diagram of the operation of the logic processing module shown in FIG. 2.

Then, the first index signal outputted by the phase detecting module 20 will be transmitted to the logic processing module 21 and the first CP 22 respectively. In this embodiment, the logic processing module 21 will receive the first index signal and perform a probability adjusting and a high-frequency dithering to the first index signal to generate a second index signal. Please refer to FIG. 3. FIG. 3 shows a detailed scheme diagram of the operation of the logic processing module 21 shown in FIG. 2.

As shown in FIG. 3, the logic processing module 21 comprises a digital low-pass filter 210, a first high-frequency dithering generator 211, a second high-frequency dithering generator 212, a first OR gate 213, and a second OR gate 214. Wherein, the digital low-pass filter 210 is coupled to the first OR gate 213 and the second OR gate 214; the first high-frequency dithering generator 211 is coupled to the first OR gate 213; the second high-frequency dithering generator 212 is coupled to the second OR gate 214. It should be noticed that the relationship between the first high-frequency dithering generator 211 and the second high-frequency dithering generator 212 can be correlated or independent.

When the digital low-pass filter 210 receives the first index signal (up-index UP or down-index DN) from its input end, the digital low-pass filter 210 will perform a low-filtering process to the first index signal to remove the high-frequency part of the first index signal and keep the low-frequency part of the first index signal, and then the digital low-pass filter 210 outputs the adjusted up-index UPX or adjusted down-index DNX.

Then, the first OR gate 213 and the second OR gate 214 will process the low-filtered up-index UPX or adjusted down-index DNX respectively. As shown in FIG. 3, the first OR gate 213 receives the adjusted up-index UPX from the digital low-pass filter 210 and receives a first high-frequency dithering signal from the first high-frequency dithering generator 211, and then performs the high-frequency dithering according to the adjusted up-index UPX and the first high-frequency dithering signal to generate the second index signal (up-index UPO). Similarly, the second OR gate 214 receives the adjusted down-index DNX from the digital low-pass filter 210 and receives a second high-frequency dithering signal from the second high-frequency dithering generator 212, and then performs the high-frequency dithering according to the adjusted down-index DNX and the second high-frequency dithering signal to generate the second index signal (down-index DNO).

It should be noticed that after the PLL apparatus 2 performs the above-mentioned processes, not only the frequency of outputting the second index signal (UPO or DNO) is equal to or larger than the frequency of outputting the first index signal (UP or DN), but also the jitter peak shown in certain frequency region (e.g., the corner-band-frequency region) of the jitter tolerance curve in prior art can be prevented, so that the jitter tolerance curve will become smoother.

Figure 6:
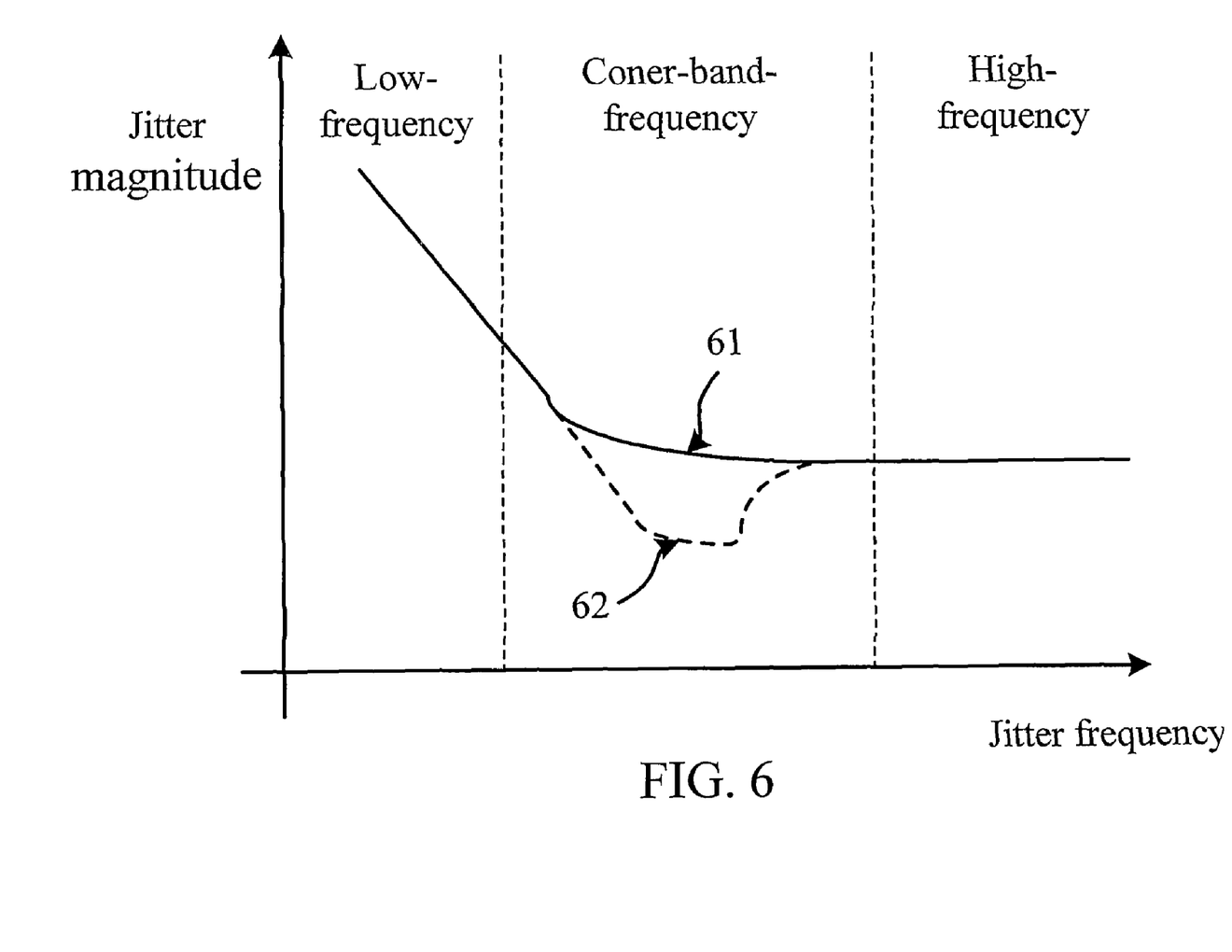
FIG. 6 shows a comparison between the jitter tolerance curves of the invention and the prior art.

For example, as shown in FIG. 6, the jitter tolerance curve 61 of the PLL apparatus 2 is smoother than the jitter tolerance curve 62 of prior art and has no jitter peak shown in the jitter tolerance curve 61. In addition, because the integration of the index signal in the PLL apparatus 2 is performed after the logic processing module 21 outputs the adjusted index signal instead of performing the integration of the index signal before the index signal is transmitted into the logic processing module, therefore, the second index signal outputted by the logic processing module 21 is in a single-bit form.

Back to FIG. 2, after the first CP 22 and the second CP 24 of the CPLF 29 receive the first index signal and the second index signal from the phase detecting module 20 and the logic processing module 21 respectively, the CPLF 29 will adjust a control voltage according to the first index signal and the second index signal, and output the adjusted control voltage. At last, the voltage control oscillator 28 will adjust the frequency or phase of the clock signal according to the control voltage, and feedback the adjusted clock signal to the phase detecting module 20, namely the feedback clock signal shown in FIG. 2.

In practical applications, the PLL apparatus 2 comprises a proportional path and an integration path, wherein the input of the proportional path is coupled to the output of the phase detecting module 20 or the output of the logic processing module 21; the input of the integration path is coupled to the output of the logic processing module 21. In fact, the integration path comprises an integrator; the proportional path comprises a proportional operation circuit. Because the integration path and the proportional path are both coupled to the adder 26, the adder 26 can receive the outputs of the integration path and the proportional path, and then output the control voltage. In addition, the PLL apparatus 2 can also comprise a D-type flip-flop (not shown in the figure), the D-type flip-flop is coupled to the clock signal and the input data signal, and used for generate an output data signal according to the clock signal.

Figure 4:
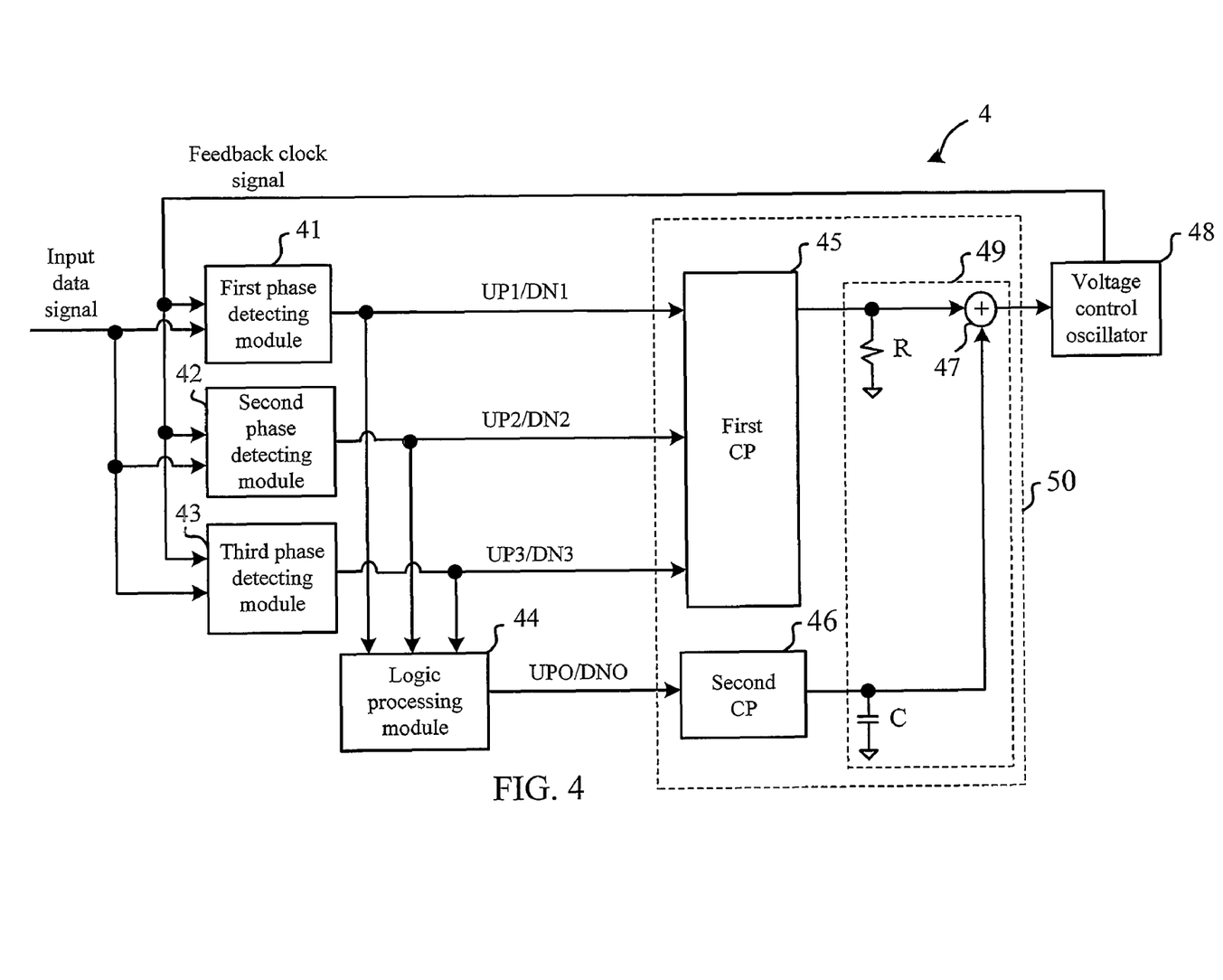
FIG. 4 shows a scheme diagram of the PLL apparatus in the second embodiment according to the invention.

A second embodiment of the invention is also a PLL apparatus. Please refer to FIG. 4. FIG. 4 shows a scheme diagram of the PLL apparatus of the second embodiment in this invention. As shown in FIG. 4, the PLL apparatus 4 comprises a first phase detecting module 41, a second phase detecting module 42, a third phase detecting module 43, a logic processing module 44, a first CP 45, a second CP 46, a voltage control oscillator 48, and a LF 49 formed by an adder 47, a resistor R, and a capacitor C. In fact, a combination of the first CP 45, the second CP 46, and the LF 49 can be called a charge pump and loop filter (CPLF) 50.

Obviously, the difference between the PLL apparatus 4 of this embodiment and the PLL apparatus 2 of the first embodiment is that the PLL apparatus 4 has a plurality of phase detecting modules. If the PLL apparatus has N phase detecting modules, N is a positive integer, the rate that the N phase detecting modules detect the input data signal will become (1/N). Therefore, in this embodiment, the rate that the three phase detecting modules detect the input data signal will become ⅓.

Figure 5:
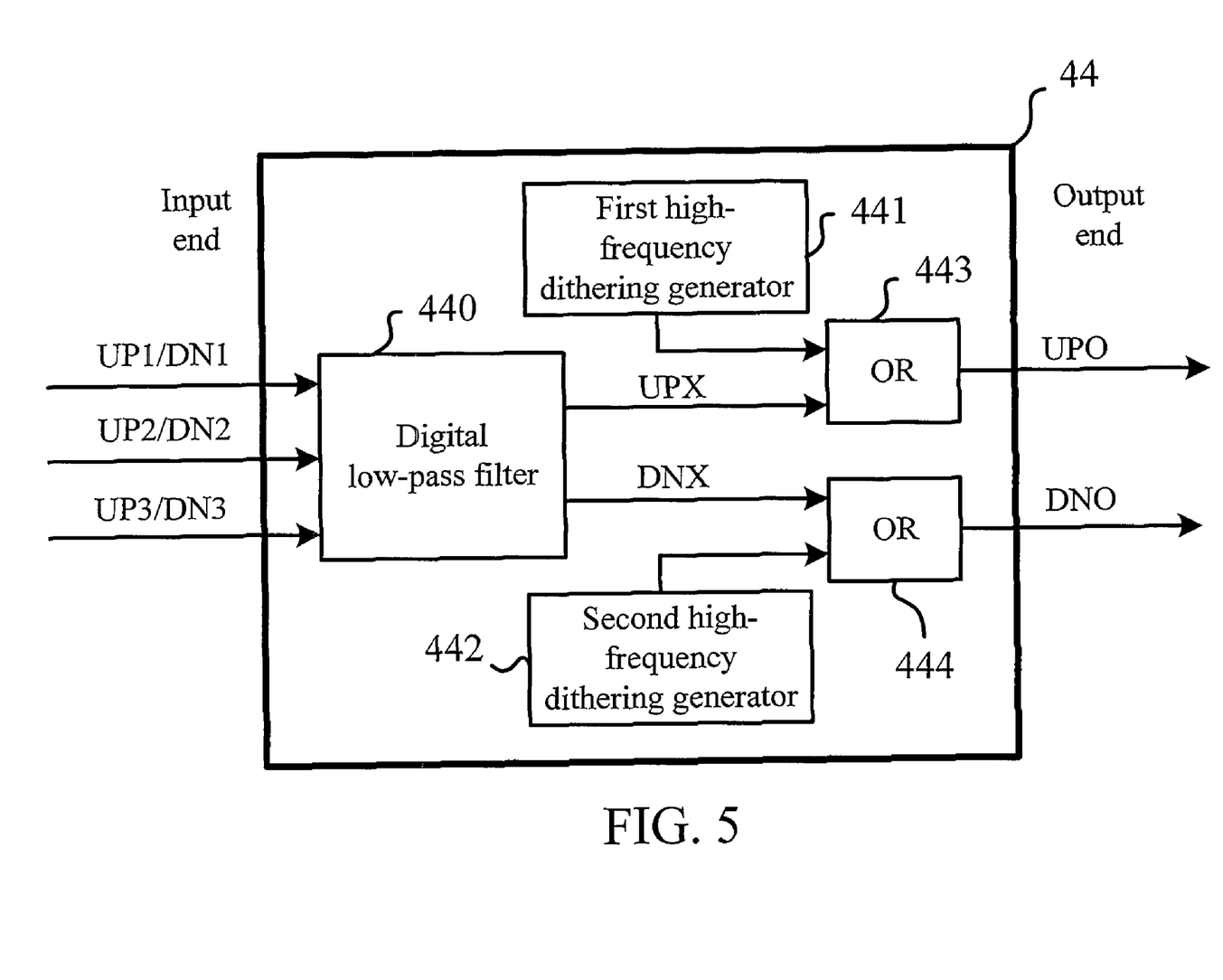
FIG. 5 shows a detailed scheme diagram of the operation of the logic processing module shown in FIG. 4.

In this embodiment, the first phase detecting module 41, the second phase detecting module 42, and the third phase detecting module 43 will receive an input data signal and a clock signal respectively, and detect the phase difference between the input data signal and the clock signal to generate three first index signals UP1/DN1, UP2/DN2, and UP3/DN3 respectively. Then, the logic processing module 44 will receive the index signals UP1/DN1, UP2/DN2, and UP3/DN3 from the first phase detecting module 41, the second phase detecting module 42, and the third phase detecting module 43 to generate a processed index signal UPO/DNO. FIG. 5 shows the detailed scheme diagram of the operation of the logic processing module 44, and since it is similar to the logic processing module 21 of FIG. 3, it is not described again here.

Back to FIG. 4, after the first CP 45 and the second CP 46 of the SPLF 50 receive the three first index signals UP1/DN1, UP2/DN2, and UP3/DN3 and the second index signal from the first phase detecting module 41, the second phase detecting module 42, the third phase detecting module 43, and the logic processing module 44 respectively, the CPLF 50 will adjust a control voltage according to the three first index signals UP1/DN1, UP2/DN2, UP3/DN3, and the second index signal, and output the adjusted control voltage. At last, the voltage control oscillator 48 will adjust the frequency or phase of the clock signal according to the control voltage, and feedback the adjusted clock signal to the first phase detecting module 41, the second phase detecting module 42, and the third phase detecting module 43, namely the feedback clock signal shown in FIG. 4.

In practical applications, the PLL apparatus 4 comprises a proportional path and an integration path, wherein the input of the proportional path is coupled to the outputs of the first phase detecting module 41, the second phase detecting module 42, and the third phase detecting module 43 or the output of the logic processing module 44; the input of the integration path is coupled to the output of the logic processing module 44. In fact, the integration path comprises an integrator; the proportional path comprises a proportional operation circuit. Because the integration path and the proportional path are both coupled to the adder 47, the adder 47 can receive the outputs of the integration path and the proportional path, and then output the control voltage. In addition, the PLL apparatus 4 can also comprise a D-type flip-flop (not shown in the figure), the D-type flip-flop is coupled to the clock signal and the input data signal, and used for generate an output data signal according to the clock signal.

Compared with the prior art, the PLL apparatus of the invention can perform the low-filtering process to the first index signal via the logic processing module, and perform the high-frequency dithering process to make the frequency of outputting the second index signal equal to or larger than the frequency of outputting the first index signal and in single-bit form, so that the jitter peak shown in certain frequency region of the jitter tolerance curve can be prevented to improve the performance of the conventional PLL apparatus.

With the recitations of the preferred embodiment above, the features and spirits of the invention will be hopefully well described. However, the scope of the invention is not restricted by the preferred embodiment disclosed above. The objective is that all alternative and equivalent arrangements are hopefully covered in the scope of the appended claims of the invention. Accordingly, the above disclosure should be construed as limited only by the metes and bounds of the appended claims.

What is claimed is:

1. A phase lock loop (PLL) apparatus, comprising:
   a phase detecting module, when the phase detecting module receives an input data signal and a clock signal, the phase detecting module detecting the phase difference between input data signal and the clock signal to generate a first index signal;
   a logic processing module, coupled to the phase detecting module, for receiving the first index signal and processing a high-frequency dithering to the first index signal to generate a second index signal;
   a charge pump and loop filter (CPLF), coupled to the logic processing module, for receiving the first index signal and the second index signal, adjusting a control voltage according to the first index signal and the second index signal, and then outputting the control voltage; and
   a voltage control oscillator, coupled to the CPLF, for adjusting frequency or phase of the clock signal according to the control voltage, and then outputting the adjusted clock signal to the phase detecting module;
   wherein the frequency of outputting the second index signal is equal to or larger than the frequency of outputting the first index signal.

2. The PLL apparatus of claim 1, wherein the first index signal and the second index signal are up-indexes or down-indexes.

3. The PLL apparatus of claim 1, wherein the high-frequency dithering is used for decreasing the probability that a jitter peak is shown in a jitter tolerance curve related to the PLL apparatus.

4. The PLL apparatus of claim 1, wherein the logic processing module also processes a low-filtering to the first index signal before the high-frequency dithering is processed to the first index signal, so that the frequency of outputting the second index signal is equal to or larger than the frequency of outputting the first index signal.

5. The PLL apparatus of claim 1, further comprising:
   a proportional path with an input coupled to the output of the phase detecting module or the output of the logic processing module;
   an integration path with an input coupled to the output of the logic processing module; and
   an adder, coupled to the proportional path and the integration path, for receiving the outputs of the proportional path and the integration path and outputting the control voltage.

6. The PLL apparatus of claim 5, wherein the integration path comprises an integrator.

7. The PLL apparatus of claim 5, wherein the second index signal outputted by the logic processing module is in a single-bit form for increasing or decreasing the value of the integration performed by the integration path.

8. The PLL apparatus of claim 5, further comprising:
a D-type flip-flop, coupled to the clock signal and the output data signal, for generating an output data signal according to the clock signal.

9. The PLL apparatus of claim 1, wherein the logic processing module comprises:
a first high-frequency dithering generator, if the first index signal is up-index, the first high-frequency dithering generator will process the high-frequency dithering to the first index signal; and
a second high-frequency dithering generator, if the first index signal is down-index, the second high-frequency dithering generator will process the high-frequency dithering to the first index signal;
wherein the first high-frequency dithering generator and the second high-frequency dithering generator are correlated or independent.

10. The PLL apparatus of claim 1, wherein the logic processing module comprises:
a low-filter, for processing a low-filtering to the first index signal;
a first high-frequency dithering generator, coupled to the low-filter, if the low-filtered first index signal is up-index, the first high-frequency dithering generator will process the high-frequency dithering to the first index signal; and
a second high-frequency dithering generator, coupled to the low-filter, if the low-filtered first index signal is down-index, the second high-frequency dithering generator will process the high-frequency dithering to the first index signal;
wherein the first high-frequency dithering generator and the second high-frequency dithering generator are correlated or independent.

11. A phase lock loop (PLL) apparatus, comprising:
a plurality of phase detecting modules, when the plurality of phase detecting modules receive an input data signal and a clock signal, the plurality of phase detecting modules detecting the phase difference between input data signal and the clock signal to generate a plurality of first index signals;
a logic processing module, coupled to the plurality of phase detecting modules, for receiving the plurality of first index signals and processing a high-frequency dithering to the plurality of first index signals to generate a second index signal;
a charge pump and loop filter (CPLF), coupled to the logic processing module, for receiving the plurality of first index signals and the second index signal, adjusting a control voltage according to the plurality of first index signals and the second index signal, and then outputting the control voltage; and
a voltage control oscillator, coupled to the CPLF, for adjusting frequency or phase of the clock signal according to the control voltage, and then outputting the adjusted clock signal to the plurality of phase detecting modules;
wherein the frequency of outputting the second index signal is equal to or larger than the frequency of outputting one of the first index signals.

12. The PLL apparatus of claim 11, wherein the plurality of first index signals and the second index signal are up-indexes or down-indexes.

13. The PLL apparatus of claim 11, wherein the high-frequency dithering is used for decreasing the probability that a jitter peak is shown in a jitter tolerance curve related to the PLL apparatus.

14. The PLL apparatus of claim 11, wherein the logic processing module also processes a low-filtering to the plurality of first index signals before the high-frequency dithering is processed to the plurality of first index signals, so that the frequency of outputting the second index signal is equal to or larger than the frequency of outputting one of the first index signals.

15. The PLL apparatus of claim 11, further comprising:
a proportional path with an input coupled to the output of the plurality of phase detecting modules or the output of the logic processing module;
an integration path with an input coupled to the output of the logic processing module; and
an adder, coupled to the proportional path and the integration path, for receiving the outputs of the proportional path and the integration path and outputting the control voltage.

16. The PLL apparatus of claim 15, wherein the integration path comprises an integrator.

17. The PLL apparatus of claim 15, wherein the second index signal outputted by the logic processing module is in a single-bit form for increasing or decreasing the value of the integration performed by the integration path.

18. The PLL apparatus of claim 15, further comprising:
a D-type flip-flop, coupled to the clock signal and the output data signal, for generating an output data signal according to the clock signal.

19. The PLL apparatus of claim 11, wherein the logic processing module comprises:
a first high-frequency dithering generator, if one of the first index signals is up-index, the first high-frequency dithering generator will process the high-frequency dithering to the first index signal; and
a second high-frequency dithering generator, if the first index signal is down-index, the second high-frequency dithering generator will process the high-frequency dithering to the first index signal;
wherein the first high-frequency dithering generator and the second high-frequency dithering generator are correlated or independent.

20. The PLL apparatus of claim 11, wherein the logic processing module comprises:
a low-filter, for processing a low-filtering to the plurality of first index signals;
a first high-frequency dithering generator, coupled to the low-filter, if one of the low-filtered first index signals is up-index, the first high-frequency dithering generator will process the high-frequency dithering to the first index signal; and
a second high-frequency dithering generator, coupled to the low-filter, if the low-filtered first index signal is down-index, the second high-frequency dithering generator will process the high-frequency dithering to the first index signal;
wherein the first high-frequency dithering generator and the second high-frequency dithering generator are correlated or independent.

* * * * *